US012604766B2

(12) United States Patent
Chen et al.

(10) Patent No.: US 12,604,766 B2
(45) Date of Patent: Apr. 14, 2026

(54) SEMICONDUCTOR PACKAGE STRUCTURE

(71) Applicant: MEDIATEK INC., Hsinchu City (TW)

(72) Inventors: Hsiao-Yun Chen, Hsinchu City (TW);
Yao-Tsung Huang, Hsinchu City (TW);
Cheng-Jyi Chang, Hsinchu City (TW)

(73) Assignee: MEDIATEK INC., Hsinchu City (TW)

( * ) Notice: Subject to any disclaimer, the term of this
patent is extended or adjusted under 35
U.S.C. 154(b) by 696 days.

(21) Appl. No.: 17/934,233

(22) Filed: Sep. 22, 2022

(65) Prior Publication Data

US 2023/0125239 A1     Apr. 27, 2023

Related U.S. Application Data

(60) Provisional application No. 63/270,605, filed on Oct.
22, 2021.

(51) Int. Cl.
H01L 25/18          (2023.01)
H01L 23/00          (2006.01)
(Continued)

(52) U.S. Cl.
CPC .......... H01L 25/18 (2013.01); H01L 23/3128
(2013.01); H01L 23/481 (2013.01);
(Continued)

(58) Field of Classification Search
None
See application file for complete search history.

(56) References Cited

U.S. PATENT DOCUMENTS 9,496,196 B2 * 11/2016 Yu ......................... H01L 23/481
9,893,042 B2    2/2018 Yu et al.
(Continued)

FOREIGN PATENT DOCUMENTS

CN          113363162 A      9/2021
DE     102016100523 A1      5/2017
(Continued)

OTHER PUBLICATIONS

Chinese language office action dated Jun. 29, 2023, issued in
application No. TW 111140052.
(Continued)

*Primary Examiner* — Long Pham
(74) *Attorney, Agent, or Firm* — McClure, Qualey &
Rodack, LLP

(57)          ABSTRACT
A semiconductor package structure includes a first redistribution layer, a first semiconductor die, a second through via, a molding material, a second semiconductor die, and a second redistribution layer. The first semiconductor die is disposed over the first redistribution layer and includes a first through via having a first width. The second through via is adjacent to the first semiconductor die and has a second width. The second width is greater than the first width. The molding material surrounds the first semiconductor die and the second through via. The second semiconductor die is disposed over the molding material and is electrically coupled to the first through via and the second through via. The second redistribution layer is disposed over the second semiconductor die.

20 Claims, 11 Drawing Sheets

(51) Int. Cl.

| | | |
|---|---|---|
| *H01L 23/31* | (2006.01) | |
| *H01L 23/48* | (2006.01) | |
| *H01L 23/498* | (2006.01) | |

(52) U.S. Cl.

CPC ........ *H01L 23/49827* (2013.01); *H01L 24/16* (2013.01); *H01L 2224/16145* (2013.01)

(56) References Cited

U.S. PATENT DOCUMENTS

| 11,855,020 | B2 | 12/2023 | Yu | |
| 11,942,433 | B2 | 3/2024 | Yu | |
| 12,132,024 | B2 * | 10/2024 | Tsai | .................... H01L 23/5385 |
| 2012/0056316 | A1 | 3/2012 | Pagaila | |
| 2013/0069239 | A1 * | 3/2013 | Kim | .................... H01L 23/5389 |
| | | | | 257/774 |
| 2013/0075903 | A1 | 3/2013 | Pagaila et al. | |
| 2015/0028450 | A1 | 1/2015 | Park et al. | |

| 2015/0303174 | A1 | 10/2015 | Yu | |
| 2018/0061741 | A1 | 3/2018 | Beyne | |
| 2019/0103386 | A1 | 4/2019 | Chen et al. | |
| 2020/0243184 | A1 * | 7/2020 | Nagata | .................... G06T 17/20 |
| 2020/0328161 | A1 | 10/2020 | Lin | |
| 2021/0057362 | A1 | 2/2021 | Chen | |
| 2021/0296251 | A1 | 9/2021 | Chen et al. | |
| 2024/0387347 | A1 * | 11/2024 | Peng | .................... H01L 23/538 |

FOREIGN PATENT DOCUMENTS

| DE | 102020112959 | A1 | 6/2021 |
| TW | 201721828 | A | 6/2017 |

OTHER PUBLICATIONS

German language office action dated Jun. 14, 2024, issued in application No. DE 10 2022 127 096.3.

* cited by examiner

SEMICONDUCTOR PACKAGE STRUCTURE

CROSS REFERENCE TO RELATED APPLICATIONS

This application claims the benefit of U.S. Provisional Application No. 63/270,605 filed on Oct. 22, 2021, the entirety of which is incorporated by reference herein.

BACKGROUND OF THE INVENTION

Field of the Invention

The present invention relates to semiconductor packaging technology, and, in particular, to a semiconductor package structure.

Description of the Related Art

A semiconductor package structure can not only provide a semiconductor die with protection from environmental contaminants, but it can also provide an electrical connection between the semiconductor die packaged therein and a substrate, such as a printed circuit board (PCB).

Although existing semiconductor package structures have generally been adequate, they are not satisfactory in every respect. For example, as the semiconductor dies include more and more functions, the cost and difficulty of manufacturing the semiconductor package structures also increases. Therefore, further improvements in semiconductor package structures are required.

BRIEF SUMMARY OF THE INVENTION

Semiconductor package structures are provided. An exemplary embodiment of a semiconductor package structure includes a first redistribution layer, a first semiconductor die, a second through via, a molding material, a second semiconductor die, and a second redistribution layer. The first semiconductor die is disposed over the first redistribution layer and includes a first through via having a first width. The second through via is adjacent to the first semiconductor die and has a second width. The second width is greater than the first width. The molding material surrounds the first semiconductor die and the second through via. The second semiconductor die is disposed over the molding material and is electrically coupled to the first through via and the second through via. The second redistribution layer is disposed over the second semiconductor die.

Another exemplary embodiment of a semiconductor package structure includes a first redistribution layer, a first semiconductor die, a second through via, a second semiconductor die, a third through via, and a second redistribution layer. The first semiconductor die is disposed over the first redistribution layer and includes a first through via. The second through via is adjacent to the first semiconductor die. The second semiconductor die is disposed over a first portion of the first semiconductor die and is electrically coupled to the first through via and the second through via. The third through via is disposed over a second portion of the first semiconductor die. The second redistribution layer is disposed over the second semiconductor die and is electrically coupled to the third through via.

Yet another exemplary embodiment of a semiconductor package structure includes a first redistribution layer, an interposer, a semiconductor die, and a second redistribution layer. The interposer is disposed over the first redistribution layer and includes a through via and a deep trench capacitor. The semiconductor die is disposed over the interposer and is electrically coupled to the through via and the deep trench capacitor. The second redistribution layer is disposed over the second semiconductor die.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
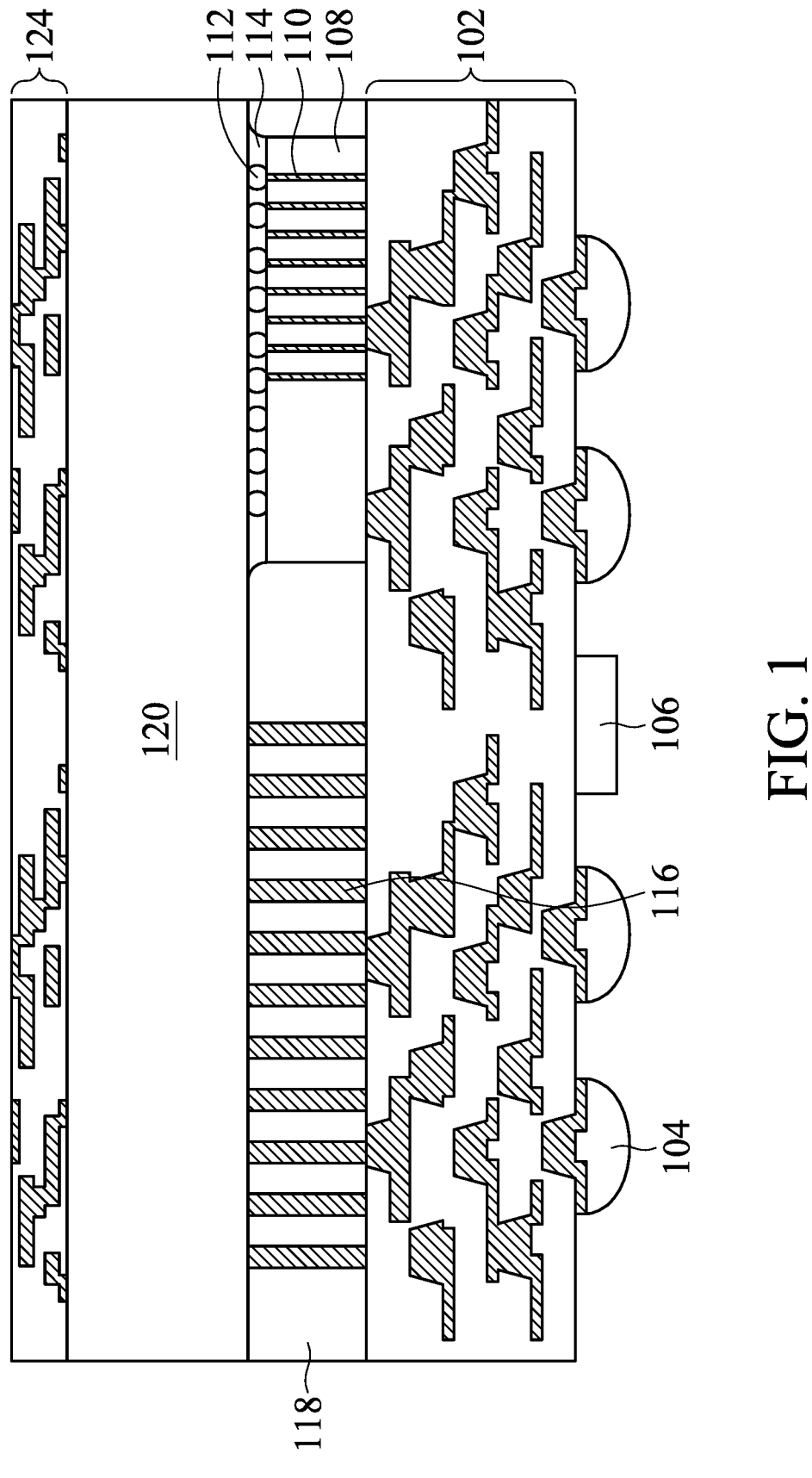
FIG. 1 is a cross-sectional view of an exemplary semiconductor package structure in accordance with some embodiments.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "forming a first element on a second element" may include embodiments in which the first element is in direct contact with the second element, and may also include embodiments in which additional elements are disposed between the first element and the second element such that the first element and the second element are not in direct contact.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor package structure is described in accordance with some embodiments of the present disclosure. The semiconductor package structure includes semiconductor die partitions. In particular, the semiconductor package structure according to the present disclosure replaces a large semiconductor die with two or more semiconductor dies, so that the cost and difficulty of manufacturing can be reduced, and yield and performance can be enhanced.

FIG. 1 is a cross-section view of a semiconductor package structure 100 in accordance with some embodiments of the present disclosure. Additional features can be added to the semiconductor package structure 100. Some of the features described below can be replaced or eliminated for different embodiments. To simplify the diagram, only a portion of the semiconductor package structure 100 is illustrated.

As shown in FIG. 1, the semiconductor package structure 100 includes a first redistribution layer 102 on a frontside and a second redistribution layer 124 on a backside which is opposite to the frontside, in accordance with some embodiments. Therefore, the first redistribution layer 102 may be also referred to as the frontside redistribution layer, and the second redistribution layer 124 may be also referred to as the backside redistribution layer.

The first redistribution layer 102 and the second redistribution layer 124 may each may include one or more conductive layers disposed in one or more passivation layers. The conductive layers may be formed of conductive material, including copper, aluminum, tungsten, the like, an alloy thereof, or a combination thereof. The passivation layers may include a polymer layer, which may be formed of polyimide (PI), polybenzoxazole (PBO), benzocyclobutene (BCB), epoxy, the like, or a combination thereof. Alternatively, the passivation layers may include a dielectric layer, which may be formed of silicon oxide, silicon nitride, silicon oxynitride, the like, or a combination thereof.

As shown in FIG. 1, the first redistribution layer 102 includes more conductive layers and passivation layers than the second redistribution layer 124, in accordance with some embodiments. The first redistribution layer 102 may be thicker than the second redistribution layer 124, but the present disclosure is not limit thereto. For example, the second redistribution layer 124 may be thicker than or substantially equal to the first redistribution layer 102.

As shown in FIG. 1, the semiconductor package structure 100 includes a plurality of bump structures 104 disposed below the first redistribution layer 102 and electrically coupled to the first redistribution layer 102, in accordance with some embodiments. The bump structures 104 may include microbumps, controlled collapse chip connection (C4) bumps, solder balls, ball grid array (BGA) balls, the like, or a combination thereof. The bump structures 104 may be formed of conductive material, including copper, aluminum, tungsten, the like, an alloy thereof, or a combination thereof.

As shown in FIG. 1, the semiconductor package structure 100 includes a capacitor 106 disposed below the first redistribution layer 102 and electrically coupled to the first redistribution layer 102, in accordance with some embodiments. The capacitor 106 may be an integrated passive device (IPD) to enhance electrical properties. The capacitor 106 may be disposed between the conductive terminals 104.

As shown in FIG. 1, the semiconductor package structure 100 includes a first semiconductor die 108 disposed over the first redistribution layer 102 and a second semiconductor die 120 disposed over the first semiconductor die 108, in accordance with some embodiments. The first semiconductor die 108 may be also referred to as the bottom semiconductor die, and the second semiconductor die 120 may be also referred to as the top semiconductor die.

In some embodiments, the first semiconductor die 108 and the second semiconductor die 120 each independently includes a system-on-chip (SoC) die, a logic device, a memory device, a radio frequency (RF) device, the like, or a combination thereof. For example, the first semiconductor die 108 and the second semiconductor die 120 may each independently include a micro control unit (MCU) die, a microprocessor unit (MPU) die, a power management integrated circuit (PMIC) die, a global positioning system (GPS) device, an accelerated processing unit (APU) die, a central processing unit (CPU) die, a graphics processing unit (GPU) die, an input-output (10) die, a dynamic random access memory (DRAM) controller, a static random-access memory (SRAM), a high bandwidth memory (HBM), the like, or a combination thereof.

The size of the second semiconductor die 120 may be greater than the size of the first semiconductor die 108. The first semiconductor die 108 and the second semiconductor die 120 may include semiconductor dies manufactured at different nodes. For example, the first semiconductor die 108 may include a SRAM manufactured at matured nodes, and the second semiconductor die 120 may include a SoC manufactured at advanced nodes.

In comparison with one semiconductor die includes all functions needed, the present disclosure adopts semiconductor die partitions (including the first semiconductor die 108 and the second semiconductor die 120), and each of them includes some of the functions needed. As a result, the cost and difficulty of manufacturing can be reduced, and yield and performance can be enhanced. In addition, thermal behavior can be enhanced since thermal coupling is avoided.

In some embodiments, the semiconductor package structure 100 also includes one or more passive components (not illustrated) adjacent to the first semiconductor die 108 or the second semiconductor die 120, such as resistors, capacitors, inductors, the like, or a combination thereof.

As shown in FIG. 1, the first semiconductor die 108 has one or more through vias 110 embedded therein and electrically coupling the second semiconductor die 120 to the first redistribution layer 102, in accordance with some embodiments. The through vias 110 may be formed of conductive material, including copper, aluminum, tungsten, the like, an alloy thereof, or a combination thereof. The through vias 110 may extend from a first surface to a second surface of the first semiconductor die 108 which is opposite to the first surface.

As shown in FIG. 1, the semiconductor package structure 100 includes a plurality of bump structures 112 disposed between the first semiconductor die 108 and the second semiconductor die 120, in accordance with some embodiments of the present disclosure. The bump structures 112 may electrically couple the through vias 110 to the second semiconductor die 120.

The bump structures 112 may include microbumps, controlled collapse chip connection (C4) bumps, solder balls, ball grid array (BGA) balls, the like, or a combination thereof. The bump structures 112 may be formed of conductive material, including copper, aluminum, tungsten, the like, an alloy thereof, or a combination thereof. The first semiconductor die 108 may be bonded onto the second semiconductor die 120 through any suitable bonding techniques, such as a micro-bump bonding, a direct hybrid bonding, or the like.

As shown in FIG. 1, the semiconductor package structure 100 includes an underfill material 114 surrounding the bump structures 112 to provide structural support, in accordance with some embodiments of the present disclosure. The underfill material 114 may be formed of polymer, such as epoxy. The underfill material 114 may be dispensed with capillary force, and then be cured through any suitable curing process.

As shown in FIG. 1, the semiconductor package structure 100 includes one or more through vias 116 disposed over the first redistribution layer 102 and adjacent to the first semiconductor die 108, in accordance with some embodiments. The through vias 116 may be electrically coupled to the first redistribution layer 102. The through vias 116 may be formed of conductive material, including copper, aluminum, tungsten, the like, an alloy thereof, or a combination thereof. The second semiconductor die 120 may be electrically coupled to the capacitor 106 through the bump structures 112, the through vias 110, the through vias 116, and the first redistribution layer 102.

In some embodiments, the through vias 116 have a width greater than a width of the through vias 110. The width of the through vias 110 and the through vias 116 may be measured in the direction that is substantially parallel to the top surface of the first redistribution layer 102. In some embodiments, the width of the through vias 110 may be 2 μm to 18 μm, and the width of the through vias 116 may be 40 μm to 80 μm.

As shown in FIG. 1, the semiconductor package structure 100 includes a molding material 118 disposed over the first redistribution layer 102, in accordance with some embodiments. The molding material 118 may be formed of a nonconductive material, such as a moldable polymer, an epoxy, a resin, the like, or a combination thereof. As shown in FIG. 1, the sidewalls of the molding material 118 may be substantially coplanar with the sidewalls of the first redistribution layer 102 and the second redistribution layer 124.

The molding material 118 may surround the first semiconductor die 108 and the through vias 116, and may adjoin the sidewalls of the first semiconductor die 108. The molding material 118 may protect the first semiconductor die 108 and the through vias 116 from the environment, thereby preventing these components from damage due to, for example, the stress, the chemicals and/or the moisture.

Figure 2:
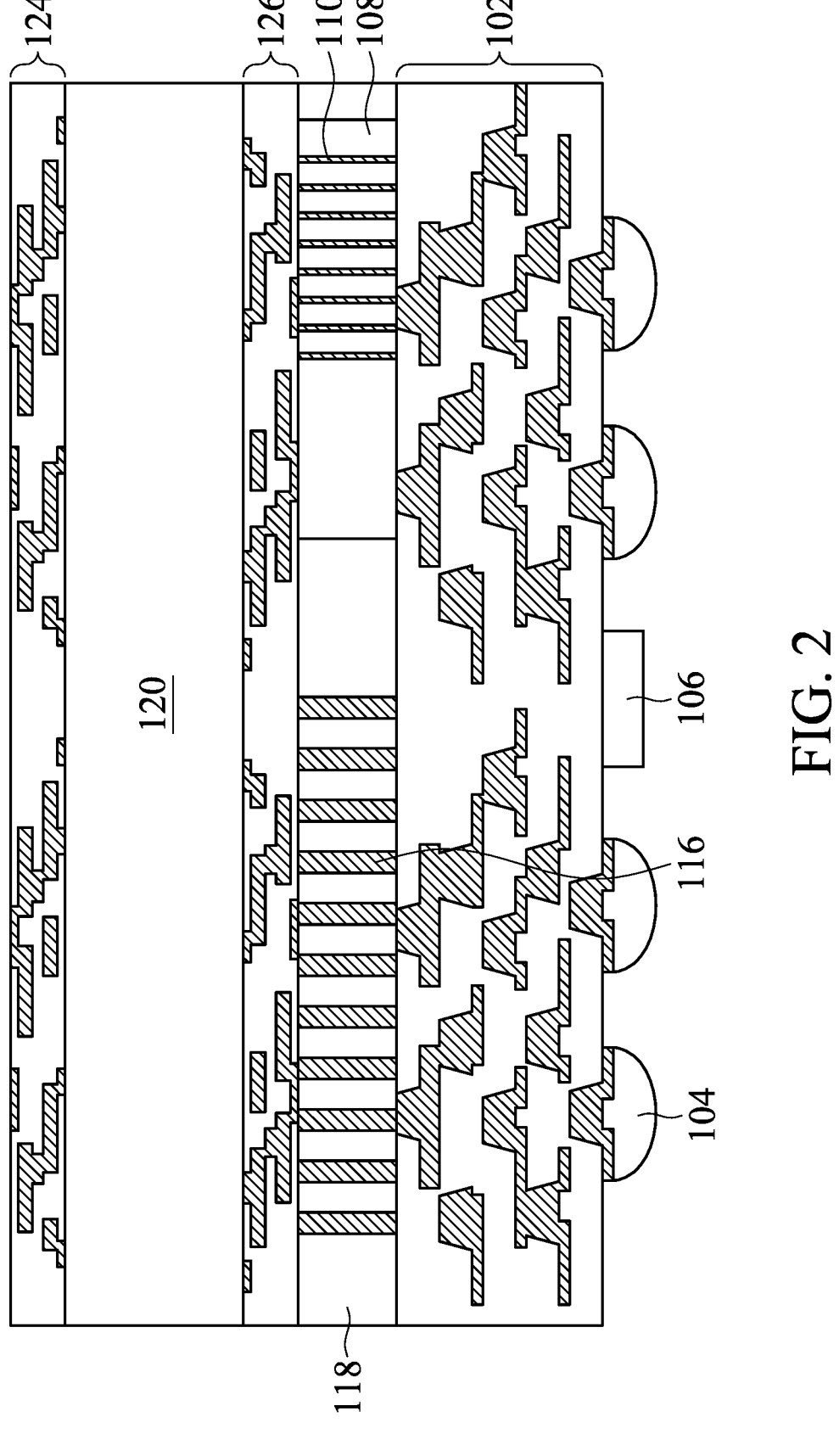
FIG. 2 is a cross-sectional view of an exemplary semiconductor package structure in accordance with some embodiments.

FIG. 2 is a cross-sectional view of a semiconductor package structure 200, in accordance with some embodiments of the disclosure. It should be noted that the semiconductor package structure 200 may include the same or similar components as that of the semiconductor package structure 100, which is illustrated in FIG. 1, and for the sake of simplicity, those components will not be discussed in detail again. In the following embodiments, a redistribution layer connects semiconductor dies.

As shown in FIG. 2, the semiconductor package structure 200 includes a third redistribution layer 126 disposed between the first semiconductor die 108 and the second semiconductor die 120, in accordance with some embodiments. The sidewalls of the third redistribution layer 126 may be substantially coplanar with the sidewalls of the molding material 118. The third redistribution layer 126 may be similar to the first redistribution layer 102 or the second redistribution layer 124, and will not be repeated. The second semiconductor die 120 may be electrically coupled to the capacitor 106 through the third redistribution layer 126, the through vias 110, the through vias 116, and the first redistribution layer 102.

Figure 3:
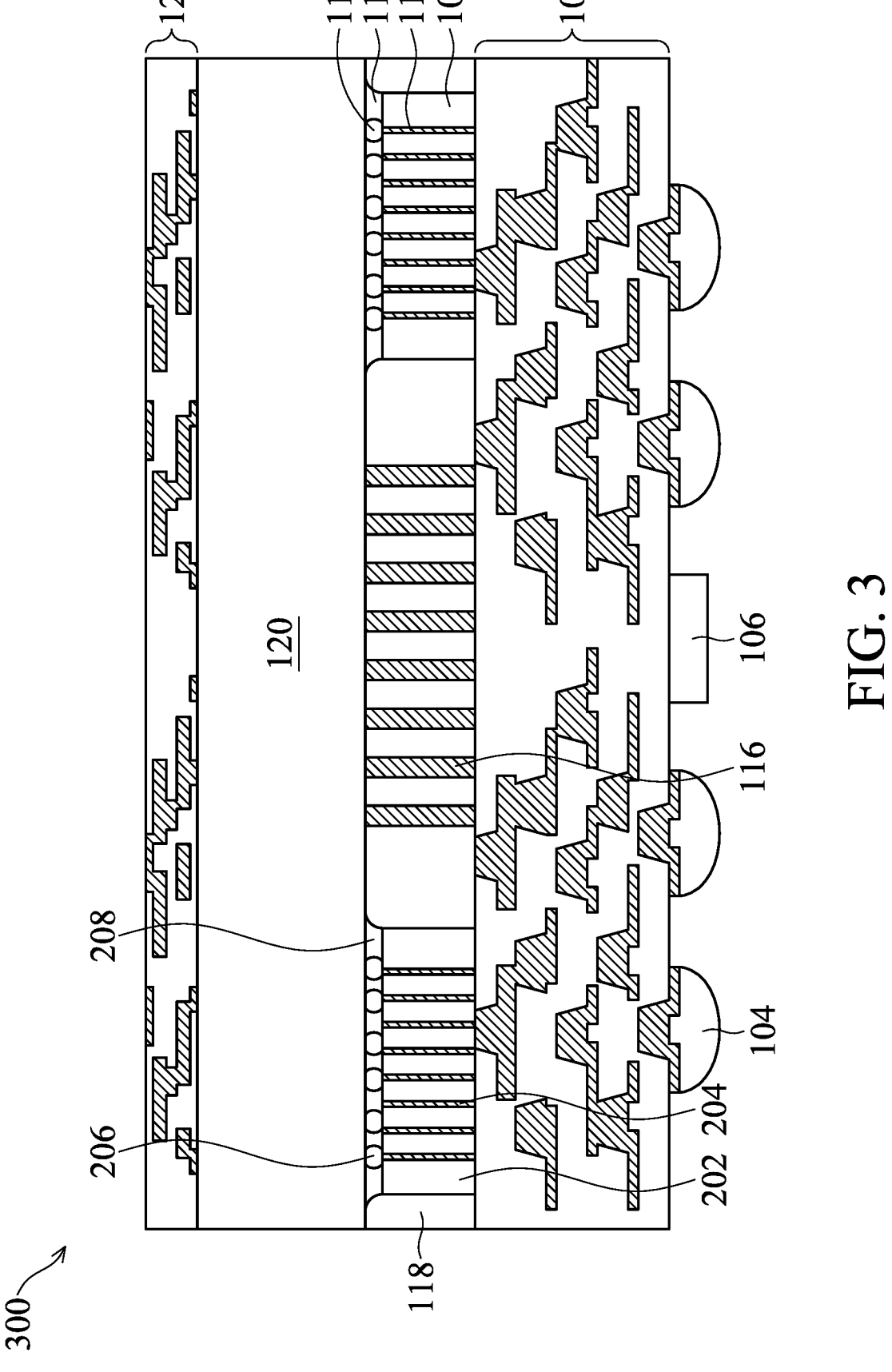
FIG. 3 is a cross-sectional view of an exemplary semiconductor package structure in accordance with some embodiments.

FIG. 3 is a cross-sectional view of a semiconductor package structure 300, in accordance with some embodiments of the disclosure. It should be noted that the semiconductor package structure 300 may include the same or similar components as that of the semiconductor package structure 100, which is illustrated in FIG. 1, and for the sake of simplicity, those components will not be discussed in detail again. In the following embodiments, the semiconductor package structure 300 includes an additional semiconductor die.

As shown in FIG. 3, the semiconductor package structure 300 includes a third semiconductor die 202 disposed between the first redistribution layer 102 and the second semiconductor die 120 and adjacent to the through vias 116, in accordance with some embodiments. The third semiconductor die 202 may be surrounded by the molding material 118. The third semiconductor die 202 may be similar to the first semiconductor die 202, and will not be repeated.

As shown in FIG. 3, the first semiconductor die 108 and the third semiconductor die 202 are disposed on opposite sides of the through vias 116, but the present disclosure is not limited thereto. The number and configuration of the semiconductor dies are shown for illustrative purposes only. For example, the first semiconductor die 108 and the third semiconductor die 202 may be disposed on the same side of the through vias 116. In some embodiments, the first semiconductor die 108 and the third semiconductor die 202 may be stacked vertically between the second semiconductor die 120 and the first redistribution layer 102. Alternatively, in some other embodiments, the semiconductor package structure 100 includes more than two semiconductor dies between the second semiconductor die 120 and the first redistribution layer 102.

As shown in FIG. 3, the third semiconductor die 202 has one or more through vias 204 embedded therein and electrically coupling the second semiconductor die 120 to the first redistribution layer 102, in accordance with some embodiments. The through vias 204 may be formed of conductive material, including copper, aluminum, tungsten, the like, an alloy thereof, or a combination thereof. The through vias 204 may extend from a first surface of the third semiconductor die 202 to a second surface of the third semiconductor die 202 which is opposite to the first surface.

In some embodiments, the through vias 204 have a width less than a width of the through vias 116. The width of the through vias 204 may be greater than, less than, or substantially equal to the width of the through vias 110 in the first semiconductor die 108. The width of the through vias 204 may be measured in the direction that is substantially parallel to the top surface of the first redistribution layer 102. In some embodiments, the width of the through vias 204 may be 2 μm to 18 μm.

As shown in FIG. 3, both of the first semiconductor die 108 and the third semiconductor die 202 include the through vias, but the present disclosure is not limited thereto. The number and configuration of the through vias are shown for illustrative purposes only. For example, the first semiconductor die 108 may include the through vias 110, and the third semiconductor die 202 may not include the through vias 204.

As shown in FIG. 3, the semiconductor package structure 300 includes a plurality of bump structures 206 between the second semiconductor die 120 and the third semiconductor die 202 and an underfill material 208 surrounding the bump structures 206, in accordance with some embodiments of the present disclosure. The bump structures 206 may electrically couple the through vias 204 to the second semiconductor die 120. The second semiconductor die 120 may be electrically coupled to the capacitor 106 through the bump structures 112, the through vias 110, the bump structures 206, the through vias 204, the through vias 116, and the first redistribution layer 102. The bump structures 206 may be similar to the bump structures 112, the underfill material 208 may be similar to the underfill material 114, and will not be repeated.

Figure 4:
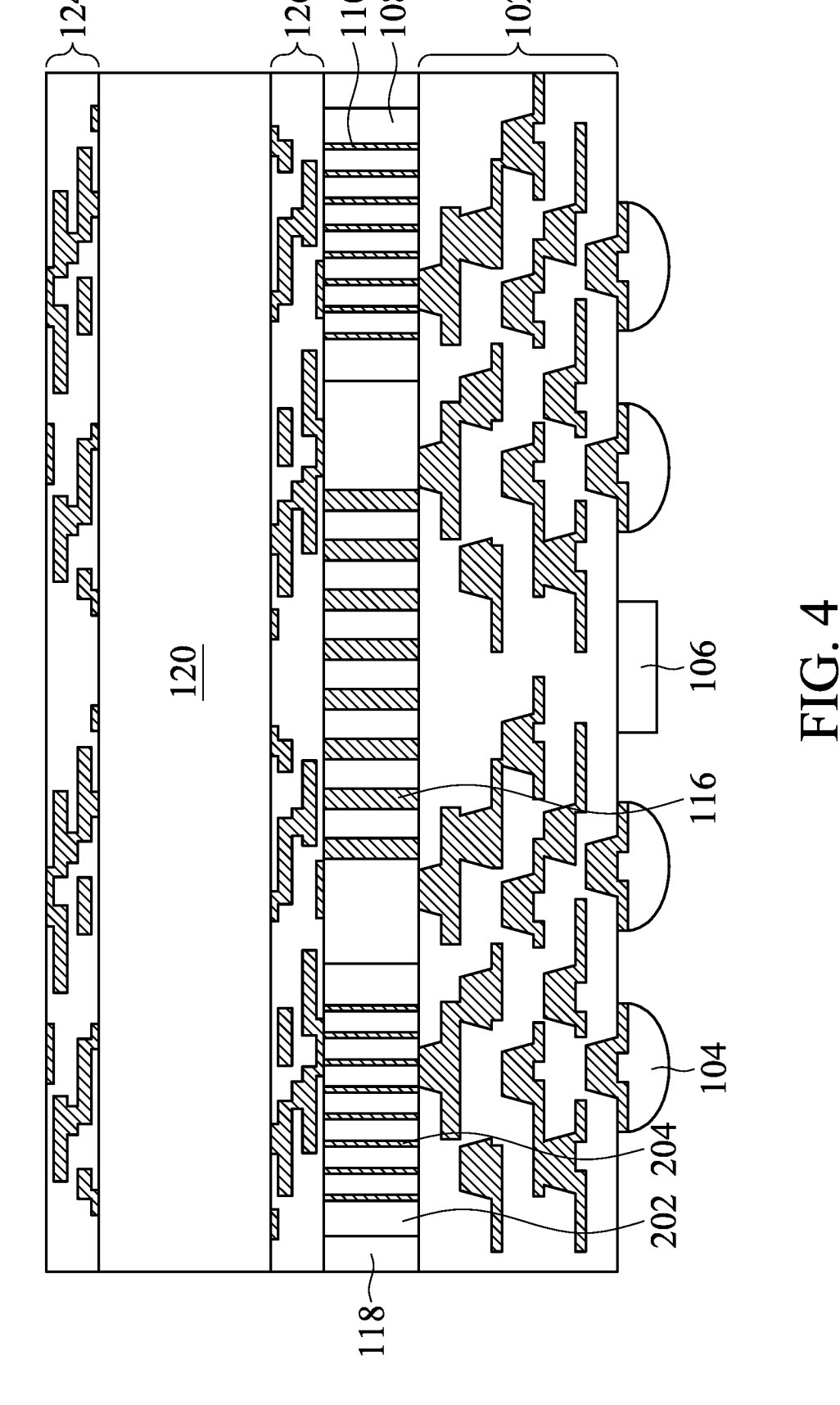
FIG. 4 is a cross-sectional view of an exemplary semiconductor package structure in accordance with some embodiments.

FIG. 4 is a cross-sectional view of a semiconductor package structure 400, in accordance with some embodiments of the disclosure. It should be noted that the semiconductor package structure 400 may include the same or similar components as that of the semiconductor package structure 300, which is illustrated in FIG. 3, and for the sake of simplicity, those components will not be discussed in detail again. In the following embodiments, a redistribution layer connects semiconductor dies.

As shown in FIG. 4, the semiconductor package structure 400 includes a third redistribution layer 126 disposed between the first semiconductor die 108 and the second semiconductor die 120, in accordance with some embodiments. The third redistribution layer 126 may be similar to the first redistribution layer 102 or the second redistribution layer 124, and will not be repeated. The second semiconductor die 120 may be electrically coupled to the capacitor 106 through the third redistribution layer 126, the through vias 110, the through vias 204, the through vias 116, and the first redistribution layer 102.

Figure 5:
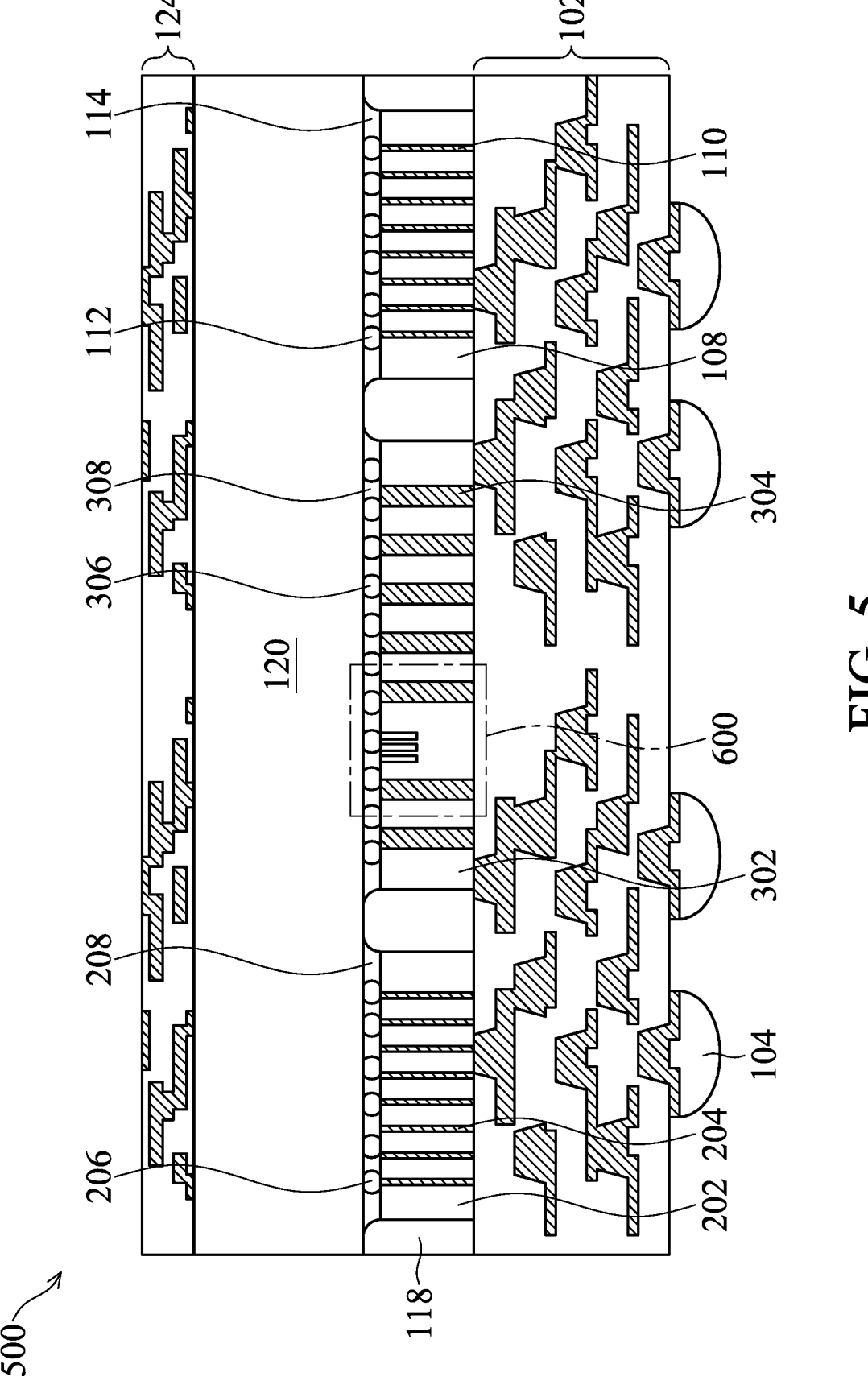
FIG. 5 is a cross-sectional view of an exemplary semiconductor package structure in accordance with some embodiments.

FIG. 5 is a cross-sectional view of a semiconductor package structure 500, in accordance with some embodiments of the disclosure. It should be noted that the semiconductor package structure 500 may include the same or similar components as that of the semiconductor package structure 100, which is illustrated in FIG. 1, and for the sake of simplicity, those components will not be discussed in detail again. In the following embodiments, the semiconductor package structure 500 includes an interposer with a deep trench capacitor therein.

As shown in FIG. 5, the semiconductor package structure 500 includes an interposer 302 disposed between the first redistribution layer 102 and the second semiconductor die 120 and adjacent to the first semiconductor die 108 and the third semiconductor die 202, in accordance with some embodiments. The interposer 302 may be surrounded by the molding material 118. Since the material of the interposer 302 has a greater thermal conductivity than the material of the molding material 118, replacing a portion of the molding material 118 with the interposer 302 can increase the efficiency of thermal dissipation of the semiconductor package structure 500.

As shown in FIG. 5, the interposer 302 includes one or more through vias 304 electrically coupled to the first redistribution layer 102, in accordance with some embodiments. The through vias 304 may be formed of conductive material, including copper, aluminum, tungsten, the like, an alloy thereof, or a combination thereof. The through vias 304 may extend from a first surface of the interposer 302 to a second surface of the interposer 302 which is opposite to the first surface.

In some embodiments, the through vias 304 have a width greater than a width of the through vias 110 in the first semiconductor die 108 and greater than a width of the through vias 204 in the third semiconductor die 202. The width of the through vias 304 may be measured in the direction that is substantially parallel to the top surface of the first redistribution layer 102. In some embodiments, the width of the through vias 304 may be 40 μm to 80 μm.

As shown in FIG. 5, the interposer 302 includes a deep trench capacitor 600, in accordance with some embodiments. The deep trench capacitor 600 may be disposed on a frontside or a backside of the interposer 302. In comparison to the capacitor disposed below the first redistribution layer 102 (such as the capacitor 106 as shown in FIG. 1), the deep trench capacitor 600 may be closer to the second semiconductor die 120. As a result, the electrical properties can be further enhanced. In addition, more bump structures 104 can be disposed for electrically coupling. The deep trench capacitor 600 will be described with reference to FIG. 6.

Figure 6:
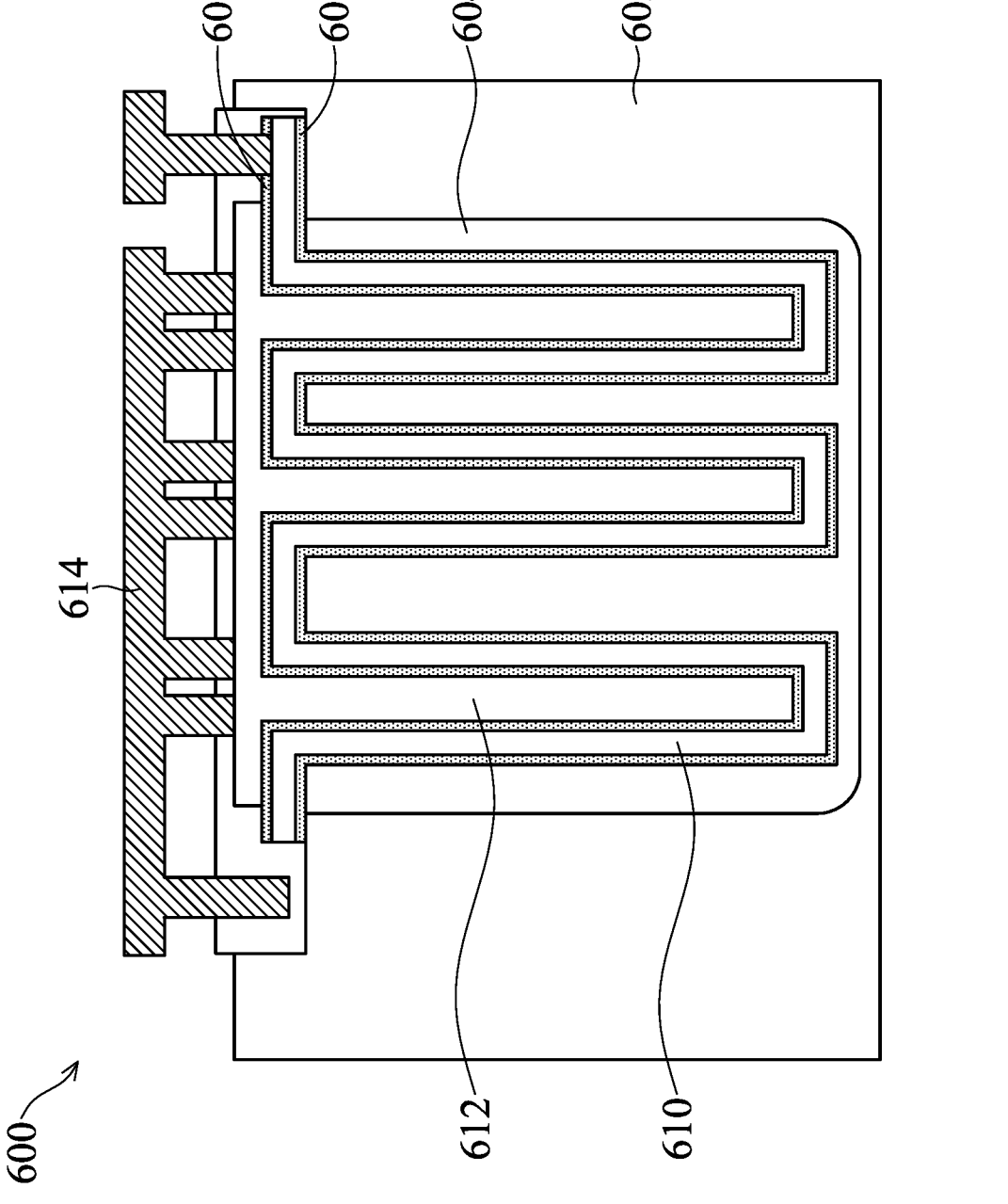
FIG. 6 is a cross-sectional view of a portion of an exemplary semiconductor package structure in accordance with some embodiments.

FIG. 6 is a cross-sectional view of a portion of the semiconductor package structure, in accordance with some embodiments of the present disclosure. Some of the components as shown in FIG. 6 may be similar to some components of the semiconductor package structure 500 as shown in FIG. 5, and for the sake of simplicity, those components will not be discussed in detail again.

As shown in FIG. 6, the deep trench capacitor 600 includes a semiconductor substrate 602, in accordance with some embodiments of the present disclosure. The semiconductor substrate 602 may be formed of semiconductor materials, including silicon, germanium, a III-V semiconductor material, the like, or a combination thereof. The semiconductor substrate 602 may be doped (e.g., using p-type or n-type dopants) and may have a first conductivity type.

The deep trench capacitor 600 includes a conductive region 604 in the semiconductor substrate 602, in accordance with some embodiments of the present disclosure. The conductive region 604 may be heavily doped (e.g., using p-type or n-type dopants) and may have a second conductivity type different from the first conductivity type. For example, the first conductivity type may be n-type, and the second conductivity type may be p-type.

As shown in FIG. 6, the deep trench capacitor 600 includes alternating dielectric layers 606, 608 and conductive layers 610, 612 in the conductive region 604, in accordance with some embodiments of the present disclosure. The dielectric layers 606 and 608 may be each independently formed of high-k dielectric materials, such as aluminum oxide. The conductive layers 610 and 612 may be each independently formed of conductive materials, such as polysilicon.

As shown in FIG. 6, the deep trench capacitor 600 includes an interconnect structure 614 disposed over the conductive region 604, in accordance with some embodiments of the present disclosure. The interconnect structure 614 may be electrically coupled to the conductive region 604 and the conductive layers 610 and 612. The interconnect structure 614 may be formed of conductive material, including copper, aluminum, tungsten, the like, an alloy thereof, or a combination thereof.

Referring back to FIG. 5, the semiconductor package structure 500 includes a plurality of bump structures 306 disposed between the interposer 302 and the second semiconductor die 120 and an underfill material 308 surrounding the bump structures 306, in accordance with some embodiments of the present disclosure. The bump structures 306 may electrically couple the through vias 304 and the deep trench capacitor 600 to the second semiconductor die 120. The bump structures 306 may be similar to the bump structures 112, the underfill material 308 may be similar to the underfill material 114, and will not be repeated.

Although two semiconductor dies (the first semiconductor die 108 and the third semiconductor die 202) below the second semiconductor die 120 are illustrated in FIG. 5, the present disclosure is not limited thereto. For example, in some embodiments, the semiconductor package structure 500 may not include the third semiconductor die 202. Alternatively, in some other embodiments, the third semiconductor die 202 may be replaced with one or more through vias (such as through vias 116 as shown in FIG. 1).

Figure 7:
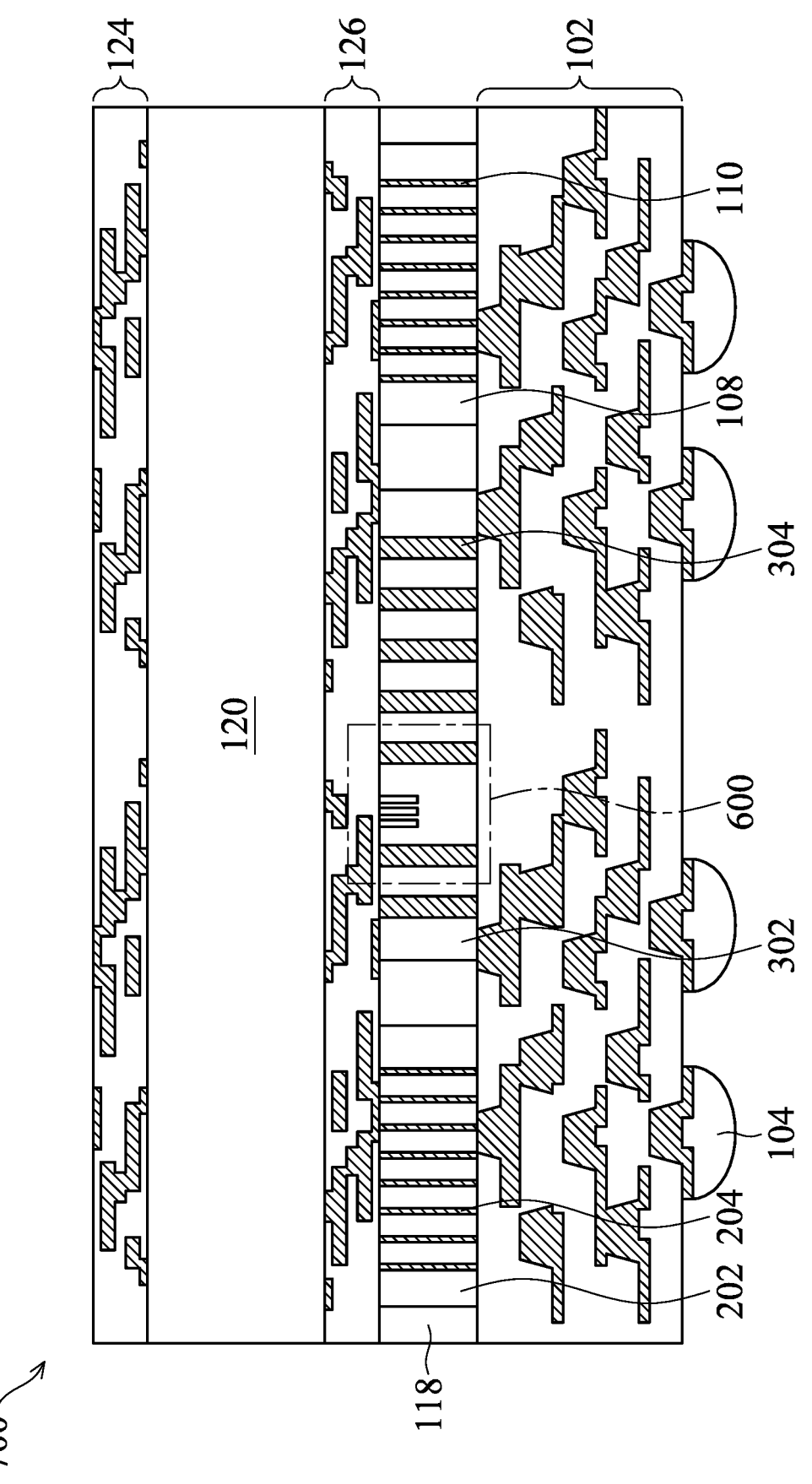
FIG. 7 is a cross-sectional view of an exemplary semiconductor package structure in accordance with some embodiments.

FIG. 7 is a cross-sectional view of a semiconductor package structure 700, in accordance with some embodiments of the disclosure. It should be noted that the semiconductor package structure 700 may include the same or similar components as that of the semiconductor package structure 500, which is illustrated in FIG. 5, and for the sake of simplicity, those components will not be discussed in detail again. In the following embodiments, a redistribution layer connects semiconductor dies and a deep trench capacitor.

As shown in FIG. 7, the semiconductor package structure 700 includes a third redistribution layer 126 disposed between the interposer 302 and the second semiconductor die 120, in accordance with some embodiments. The third redistribution layer 126 may be similar to the first redistribution layer 102 or the second redistribution layer 124, and will not be repeated. The second semiconductor die 120 may be electrically coupled to the deep trench capacitor 600 through the third redistribution layer 126.

Figure 8:
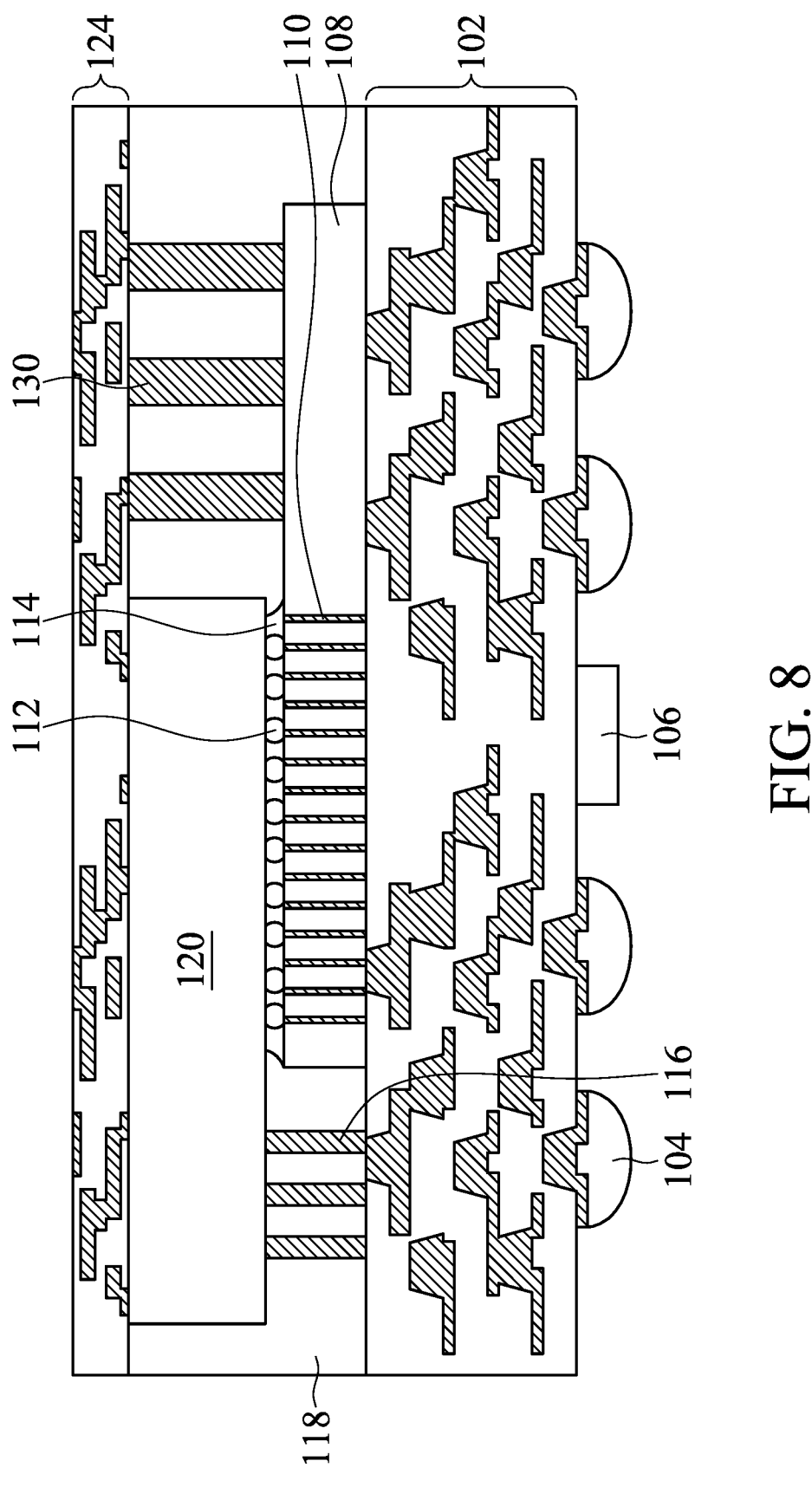
FIG. 8 is a cross-sectional view of an exemplary semiconductor package structure in accordance with some embodiments.

FIG. 8 is a cross-sectional view of a semiconductor package structure 800, in accordance with some embodiments of the disclosure. It should be noted that the semiconductor package structure 800 may include the same or similar components as that of the semiconductor package structure 100, which is illustrated in FIG. 1, and for the sake of simplicity, those components will not be discussed in detail again. In the following embodiments, one or more through vias are disposed between the bottom semiconductor die and the backside redistribution layer.

As shown in FIG. 8, the semiconductor package structure 800 includes one or more through vias 130 disposed directly over the first semiconductor die 108, in accordance with some embodiments. The through vias 130 may electrically couple the first semiconductor die 108 to the second redistribution layer 124 and enhance the communication of the first semiconductor die 108. The through vias 130 may be formed of conductive material, including copper, aluminum, tungsten, the like, an alloy thereof, or a combination thereof.

The size of the first semiconductor die 108 may be less than, greater than, or substantially equal to the size of the second semiconductor die 120. The second semiconductor die 120 may be disposed over a first portion of the first semiconductor die 108, and the through vias 130 may be disposed over a second portion of the first semiconductor die 108. In particular, the first semiconductor die 108 and the second semiconductor die 120 may be partially overlapped (i.e., shifting), and thus thermal coupling can be avoided.

In some embodiments, the through vias 130 have a width greater than a width of the through vias 110 in the first semiconductor die 108. The width of the through vias 130 may be greater than, less than, or substantially equal to the width of the through vias 116. The width of the through vias 130 may be measured in the direction that is substantially parallel to the top surface of the first redistribution layer 102. In some embodiments, the width of the through vias 130 may be 40 μm to 80 μm.

The through vias 110 in the first semiconductor die 108 may be disposed directly below the second semiconductor die 120. In some embodiments, the through vias 110 may be disposed in the first portion of the first semiconductor die 108, and may not disposed in the second portion of the first semiconductor die 108, as shown in FIG. 8. In some other embodiments, the through vias 110 may be disposed in both of the first portion and the second portion of the first semiconductor die 108. That is, the through vias 110 may be disposed directly below both of the second semiconductor die 120 and the through vias 130.

As shown in FIG. 8, the semiconductor package structure 800 includes a molding material 118 disposed between the first redistribution layer 102 and the second redistribution layer 124, in accordance with some embodiments. The molding material 118 may be formed of a nonconductive material, such as a moldable polymer, an epoxy, a resin, the like, or a combination thereof. The molding material 118 may surround the first semiconductor die 108, the through vias 116, the second semiconductor die 120, and the through vias 130 to prevent these components from damage due to, for example, the stress, the chemicals and/or the moisture.

Figure 9:
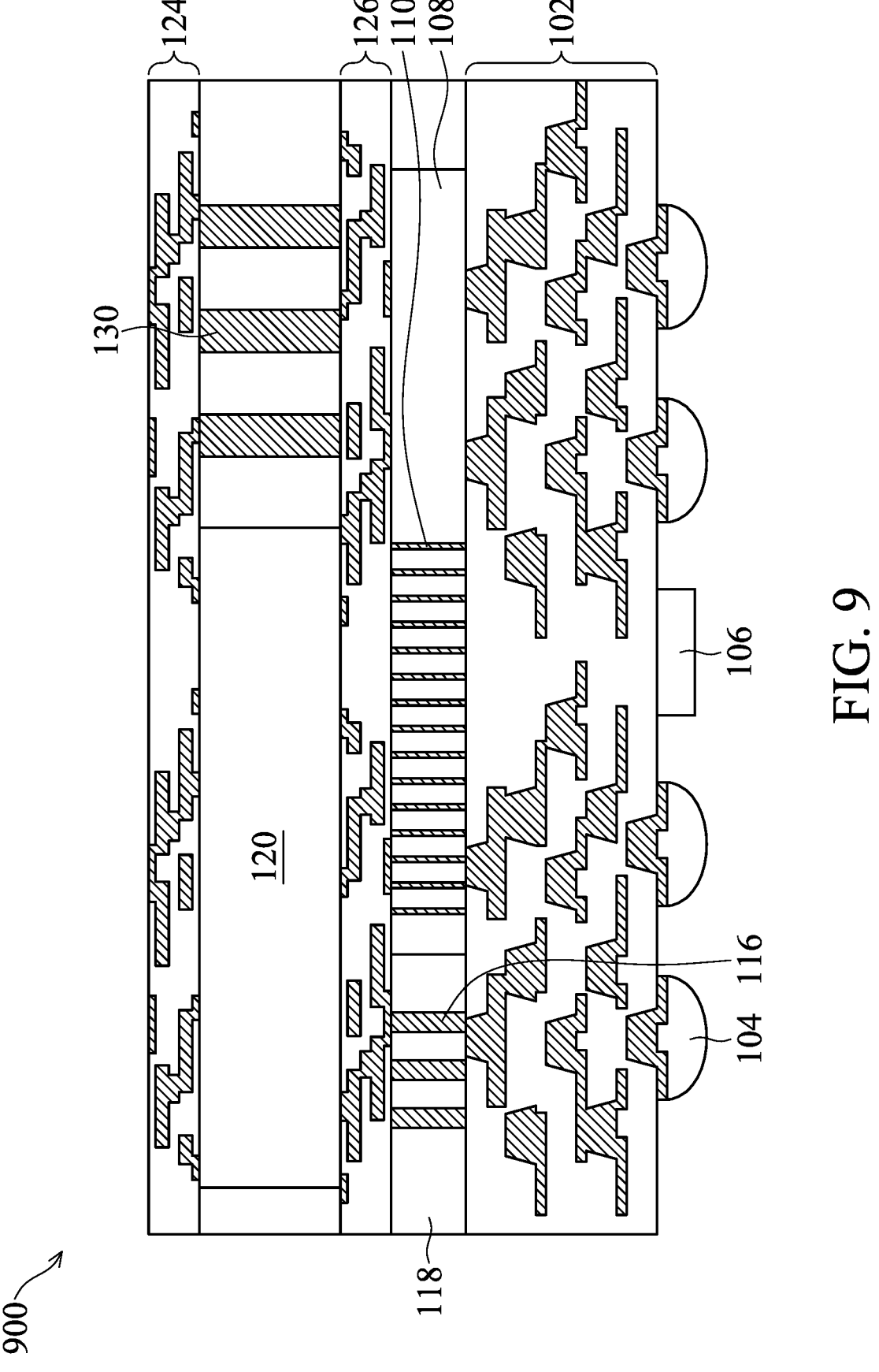
FIG. 9 is a cross-sectional view of an exemplary semiconductor package structure in accordance with some embodiments.

FIG. 9 is a cross-sectional view of a semiconductor package structure 900, in accordance with some embodiments of the disclosure. It should be noted that the semiconductor package structure 900 may include the same or similar components as that of the semiconductor package structure 800, which is illustrated in FIG. 8, and for the sake of simplicity, those components will not be discussed in detail again. In the following embodiments, a redistribution layer connects semiconductor dies and through vias.

As shown in FIG. 9, the semiconductor package structure 900 includes a third redistribution layer 126 disposed between the second semiconductor die 120 and the through vias 116 and between the first semiconductor die 108 and the through vias 130, in accordance with some embodiments. The third redistribution layer 126 may be similar to the first redistribution layer 102 or the second redistribution layer 124, and will not be repeated.

As shown in FIG. 9, the semiconductor package structure 900 includes a molding material 118 disposed between the first redistribution layer 102 and the second redistribution layer 124, in accordance with some embodiments. The third redistribution layer 126 may separate the molding material 118 into two portions. One portion of the molding material 118 may surround the first semiconductor die 108 and the through vias 116, and another portion of the molding material 118 may surround the second semiconductor die 120 and the through vias 130.

Figure 10:
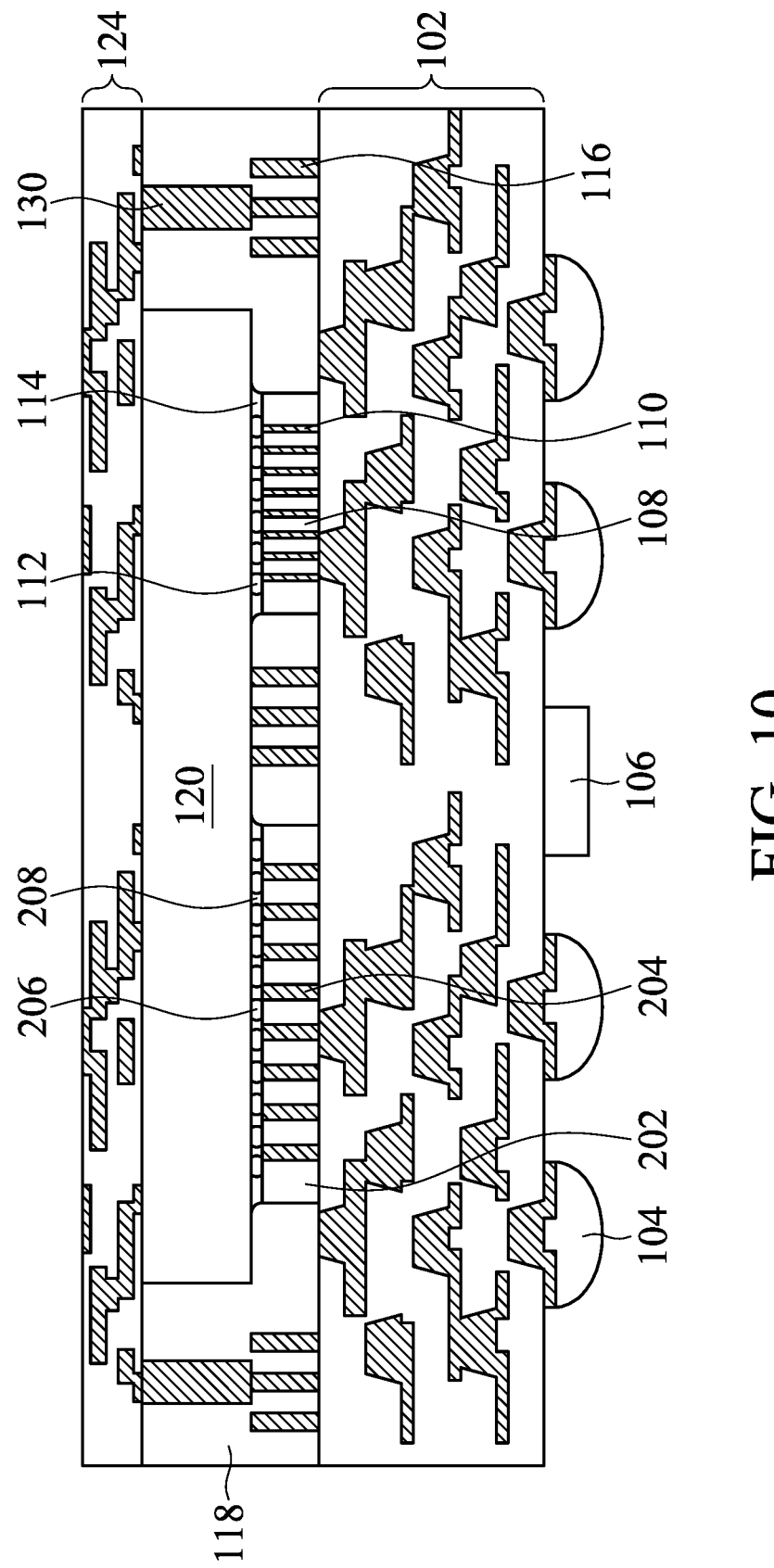
FIG. 10 is a cross-sectional view of an exemplary semiconductor package structure in accordance with some embodiments.

FIG. 10 is a cross-sectional view of a semiconductor package structure 1000, in accordance with some embodiments of the disclosure. It should be noted that the semiconductor package structure 1000 may include the same or similar components as that of the semiconductor package structure 100, which is illustrated in FIG. 1, and for the sake of simplicity, those components will not be discussed in detail again. In the following embodiments, one or more through vias are disposed between through vias and the backside redistribution layer.

As shown in FIG. 10, the semiconductor package structure 1000 includes one or more through vias 130 disposed directly over the through vias 116, in accordance with some embodiments. The through vias 130 may electrically couple the through vias 116 to the second redistribution layer 124 and enhance the communication of the first semiconductor die 108.

In some embodiments, the through vias 130 have a width greater than a width of the through vias 110 in the first semiconductor die 108. The width of the through vias 130 may be greater than, less than, or substantially equal to the width of the through vias 116. The width of the through vias 130 may be measured in the direction that is substantially parallel to the top surface of the first redistribution layer 102. In some embodiments, the width of the through vias 130 may be 40 μm to 80 μm.

As shown in FIG. 10, the semiconductor package structure 1000 includes a molding material 118 disposed between the first redistribution layer 102 and the second redistribution layer 124, in accordance with some embodiments. The molding material 118 may be formed of a nonconductive material, such as a moldable polymer, an epoxy, a resin, the like, or a combination thereof. The molding material 118 may surround the first semiconductor die 108, the through vias 116, the second semiconductor die 120, and the through vias 130 to prevent these components from damage due to, for example, the stress, the chemicals and/or the moisture.

Figure 11:
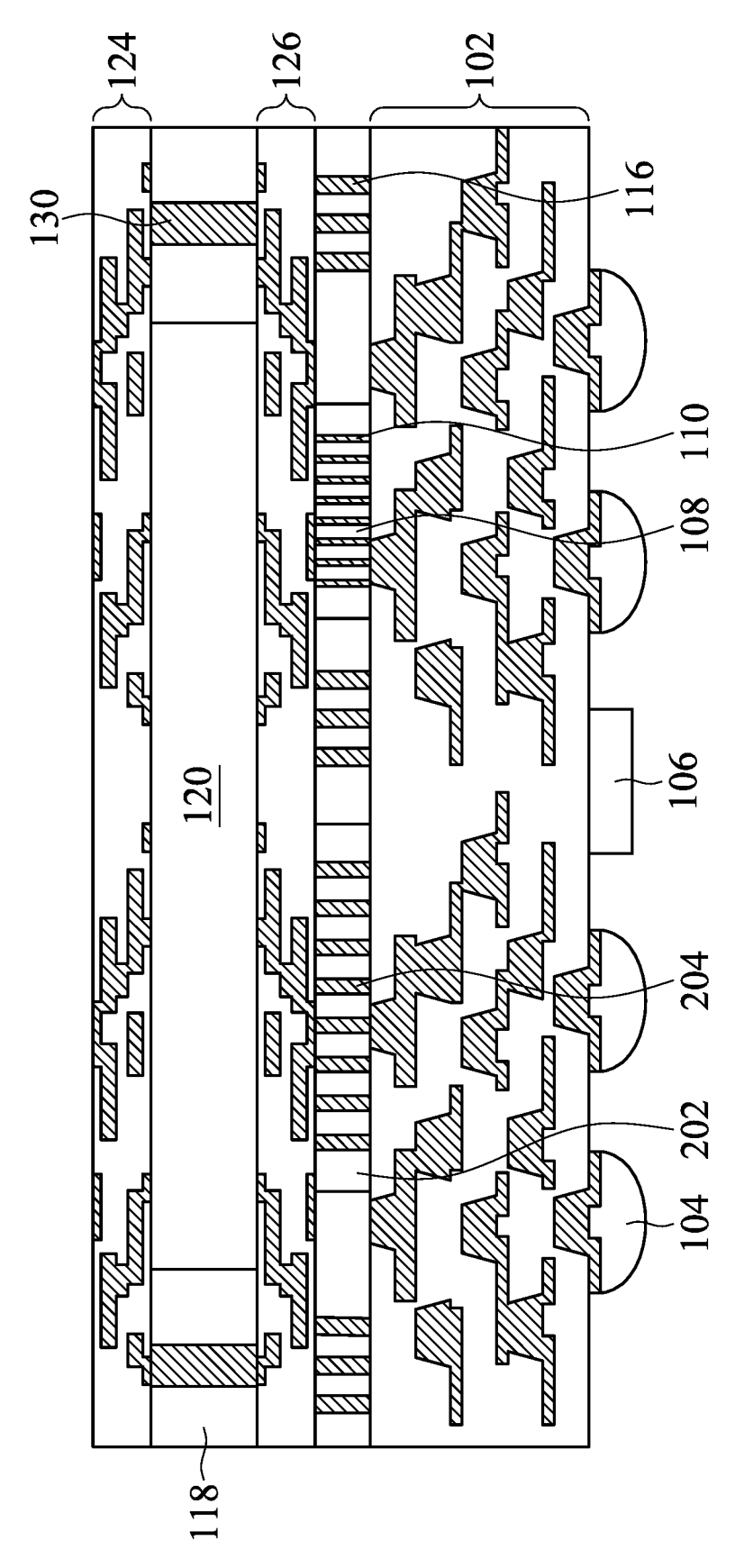
FIG. 11 is a cross-sectional view of an exemplary semiconductor package structure in accordance with some embodiments.

FIG. 11 is a cross-sectional view of a semiconductor package structure 1100, in accordance with some embodiments of the disclosure. It should be noted that the semiconductor package structure 1100 may include the same or similar components as that of the semiconductor package structure 1000, which is illustrated in FIG. 10, and for the sake of simplicity, those components will not be discussed in detail again. In the following embodiments, a redistribution layer connects semiconductor dies and through vias.

As shown in FIG. 11, the semiconductor package structure 1000 includes a third redistribution layer 126 disposed between the first semiconductor die 108 and the second semiconductor die 120 and between the through vias 116 and the through vias 130, in accordance with some embodiments. The third redistribution layer 126 may be similar to the first redistribution layer 102 or the second redistribution layer 124, and will not be repeated.

As shown in FIG. 11, the semiconductor package structure 1100 includes a molding material 118 disposed between the first redistribution layer 102 and the second redistribution layer 124, in accordance with some embodiments. The third redistribution layer 126 may separate the molding material 118 into two portions. One portion of the molding material 118 may surround the first semiconductor die 108, the third semiconductor die 202 (if exists), and the through vias 116, and another portion of the molding material 118 may surround the second semiconductor die 120 and the through vias 130.

In summary, a semiconductor package structure includes semiconductor die partitions (including a plurality of semiconductor dies stacked vertically) instead of one large semiconductor die, the cost and difficulty of manufacturing can be reduced, and yield and performance can be enhanced. Furthermore, thermal behavior can be enhanced since thermal coupling is avoided.

In some embodiments, the semiconductor package structure includes a deep trench capacitor disposed between a top semiconductor die and a frontside redistribution layer. In comparison to the capacitor disposed below the frontside redistribution layer, the deep trench capacitor is closer to the top semiconductor die. Therefore, the electrical properties can be further enhanced. In addition, more bump structures can be disposed below the frontside redistribution layer for electrically coupling.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a first redistribution layer;
   a first semiconductor die disposed over the first redistribution layer and comprising a first through via having a first width;
   a second through via adjacent to the first semiconductor die and having a second width greater than the first width;
   a molding material surrounding the first semiconductor die and the second through via;
   a second semiconductor die disposed over the molding material and electrically coupled to the first through via and the second through via; and
   a second redistribution layer disposed over the second semiconductor die,
   wherein a bottom surface of the molding material is substantially level with a bottom surface of the first semiconductor die.

2. The semiconductor package structure as claimed in claim 1, wherein the first width is 2 μm to 18 μm, and the second width is 40 μm to 80 μm.

3. The semiconductor package structure as claimed in claim 1, further comprising a bump structure connecting the first semiconductor die and the second semiconductor die.

4. The semiconductor package structure as claimed in claim 3, further comprising a third semiconductor die surrounded by the molding material, wherein the third semiconductor die comprises a third through via having a third width less than the second width.

5. The semiconductor package structure as claimed in claim 1, further comprising a third redistribution layer disposed between the first semiconductor die and the second semiconductor die and electrically coupling the second semiconductor die to the first through via and the second through via.

6. The semiconductor package structure as claimed in claim 5, further comprising a third semiconductor die surrounded by the molding material, wherein the third semiconductor die comprises a third through via having a third width less than the second width.

7. The semiconductor package structure as claimed in claim 1, further comprising an interposer disposed between the first redistribution layer and the second semiconductor die and comprising a deep trench capacitor.

8. The semiconductor package structure as claimed in claim 7, wherein the interposer comprises the second through via.

9. The semiconductor package structure as claimed in claim 7, further comprising a third redistribution layer disposed between the interposer and the second semiconductor die and electrically coupling the second semiconductor die to the deep trench capacitor.

10. The semiconductor package structure as claimed in claim 1, further comprising a third through via disposed directly over the second through via and having a third width greater than the first width.

11. The semiconductor package structure as claimed in claim 10, further comprising a third redistribution layer disposed between the first semiconductor die and the second semiconductor die and electrically coupled to the second semiconductor die, the first through via, the second through via, and the third through via.

12. The semiconductor package structure as claimed in claim 1, further comprising a third through via disposed directly over the first semiconductor die and having a third width greater than the first width.

13. The semiconductor package structure as claimed in claim 12, further comprising a third redistribution layer disposed between the second semiconductor die and the second through via and between the first semiconductor die and the third through via.

14. A semiconductor package structure, comprising:
a first redistribution layer;
a first semiconductor die disposed over the first redistribution layer and comprising a first through via;
a second through via adjacent to the first semiconductor die;
a second semiconductor die disposed over a first portion of the first semiconductor die and electrically coupled to the first through via and the second through via;
a third through via disposed over a second portion of the first semiconductor die; and
a second redistribution layer disposed over the second semiconductor die and electrically coupled to the third through via.

15. The semiconductor package structure as claimed in claim 14, wherein the first through via is disposed in the first portion of the first semiconductor die.

16. The semiconductor package structure as claimed in claim 14, further comprising a molding material surrounding the first semiconductor die, the second semiconductor die, the second through via, and the third through via.

17. The semiconductor package structure as claimed in claim 14, further comprising:
a third redistribution layer disposed between the first semiconductor die and the second semiconductor die;
a first molding material surrounding the first semiconductor die and the second through via; and
a second molding material surrounding the second semiconductor die and the third through via.

18. The semiconductor package structure as claimed in claim 17, wherein the third through via electrically couples the third redistribution layer to the second redistribution layer.

19. A semiconductor package structure, comprising:
a first redistribution layer;
a first semiconductor die disposed over the first redistribution layer;
an interposer disposed over the first redistribution layer and adjacent to the first semiconductor die, wherein the interposer comprises a through via and a deep trench capacitor;
a second semiconductor die disposed over the interposer and electrically coupled to the through via and the deep trench capacitor;
a molding material surrounding the first semiconductor die and the interposer; and
a second redistribution layer disposed over the second semiconductor die,
wherein a bottom surface of the molding material is substantially level with bottom surfaces of the first semiconductor die and the interposer.

20. The semiconductor package structure as claimed in claim 19, further comprising a third redistribution layer disposed between the interposer and the second semiconductor die and electrically coupling the second semiconductor die to the deep trench capacitor.

* * * * *